United States Patent [19]
Acocella et al.

[11] Patent Number: 5,139,851
[45] Date of Patent: Aug. 18, 1992

[54] LOW DIELECTRIC COMPOSITE SUBSTRATE

[75] Inventors: John Acocella, Hopewell Junction; Arnold I. Baise; Richard A. Bates, both of Wappingers Falls; Jon A. Casey, Poughkeepsie; David R. Clarke, Katonah, all of N.Y.; Renuka S. Divakaruni, Ridgefield, Conn.; James N. Humenik, LaGrangeville, N.Y.; Steven M. Kandetzke; Daniel P. Kirby, both of Poughkeepsie, N.Y.; John U. Knickerbocker; Sarah H. Knickerbocker, both of Hopewell Junction, N.Y.; Amy T. Matts, Poughkeepsie, N.Y.; Robert W. Nufer, Hopewell Junction, N.Y.; Srinivasa S. N. Reddy, LaGrangeville, N.Y.; Mark A. Takacs, Poughkeepsie, N.Y.; Lovell B. Wiggins, Hopewell Junction, N.Y.

[73] Assignee: International Business Machines Corporation, Armonk, N.Y.

[21] Appl. No.: 503,493

[22] Filed: Mar. 30, 1990

Related U.S. Application Data

[63] Continuation-in-part of Ser. No. 167,606, Mar. 11, 1988, abandoned.

[51] Int. Cl.$^5$ .............................................. B32B 9/00
[52] U.S. Cl. .................................. 428/209; 428/210; 428/901
[58] Field of Search ..................... 428/209, 210, 901

[56] References Cited

U.S. PATENT DOCUMENTS

| 3,515,625 | 6/1970 | Sedlak et al. | 161/160 |
| 4,135,019 | 1/1979 | Kourtides et al. | 428/117 |
| 4,303,431 | 12/1981 | Torobin | 428/904.4 |
| 4,880,684 | 11/1989 | Boss et al. | 428/209 |

*Primary Examiner*—Patrick J. Ryan
*Assistant Examiner*—Kam Lee
*Attorney, Agent, or Firm*—Ira David Blecker

[57] ABSTRACT

The cracking experienced during thermal cycling of metal:dielectric semiconductor packages results from a mismatch in thermal co-efficients of expansion. The non-hermeticity associated with such cracking can be addressed by backfilling the permeable cracks with a flexible material. Uniform gaps between the metal and dielectric materials can similarly be filled with flexible materials to provide stress relief, bulk compressibility and strength to the package. Furthermore, a permeable, skeletal dielectric can be fabricated as a fired, multilayer structure having sintered metallurgy and subsequently infused with a flexible, temperature-stable material to provide hermeticity and strength.

19 Claims, 2 Drawing Sheets

LOW DIELECTRIC COMPOSITE SUBSTRATE

CONTINUING APPLICATION DATA

This application is a continuation in part application of U.S. patent application Ser. No. 07/167,606, filed Mar. 11, 1988, entitled "Low Dielectric Composite Substrate", now abandoned.

FIELD OF THE INVENTION

The present invention relates to the field of microelectronics and in particular to semiconductor device packaging.

BACKGROUND OF THE INVENTION

In the field of microelectronic fabrication for computer applications, there is an ever-increasing demand for faster components. The semiconductor devices, themselves, are being continuously upgraded to increase speed, however, it is estimated that one-half of the processing time is taken up in inter-connection and power distribution circuitry. The delays encountered in the electronic package are therefore as critical to the overall performance time as are the device speeds. Furthermore, the reliability and useful life of components are concerns which must be addressed. One must additionally keep in mind the physical requirements and restrictions imposed by the different materials used in the overall component package. The properties desired in a semiconductor package include a thermal coefficient of expansion which is compatible with that of the devices connected thereto and the combination of a low dielectric, highly insulative material with internal conductors of high conductivity. Further physical properties which are desirable include high strength and toughness and a minimum of distortion of features during processing. The current packaging technology relies upon ceramics as the insulative materials with compatible metallurgy, such as alumina substrates with molybdenum lines and vias. The metallurgical requirements include fair conductivity and thermal stability at the processing temperatures necessary to fabricate the ceramic package.

The combination of highly insulative material, having a relatively low thermal expansion coefficient, with a good conductor, which will have a greater thermal expansion, results in tremendous stresses created in the materials during high temperature processing. Cracking can consequently occur in the insulative material. If further processing steps are performed, solvents can permeate the cracks in the package giving rise to reliability concerns.

One proposed solution to the cracking problem is to overcoat the substrate with an inorganic sealing layer, as taught in IBM *Technical Disclosure Bulletin*, Vol. 15, No. 6, page 1974 (Nov. 1972). Another article teaches filling the cracks by overcoating the ceramic with an inorganic dielectric layer and subsequently machining away the excess dielectric, down to the ceramic surface (See, IBM *Technical Disclosure Bulletin* Vol. 16, No. 2, page 624 (Jul. 1973). However, the proposed solutions to the crack problem do not address the fact that the substrate to metallurgy mismatch still exists and that further cracking may well occur due to temperature excursions encountered during processing steps conducted subsequently, such as device joining. When an overlayer sealing approach is used, thermal expansion mismatch may also be encountered between the substrate and the dielectric overlayer rendering the sealing layer itself susceptible to cracking and consequent permeability. Additionally, delamination concerns arise between a fully sintered body and a subsequently deposited glass overcoat. When using a full overlayer for sealing, the overcoat must be etched and screened to form metal vias connecting to the underlying metallurgy. The etching process may expose permeable areas of the substrate to adverse solvents and conditions. Subsequent metal deposition into those via holes, also, does not guarantee connectivity and, therefore, conductivity. Consequently, the delamination concern is compounded by the potential for creating an open in the metal contact should the metallized sealing layer expand and/or delaminate.

Attempts have been made to address the mismatch problem by matching the thermal coefficients of expansion (hereinafter TCE's) of the associated materials. However, sacrifices must then be made with regard to other equally desirable characteristics, such as the dielectric of the insulative material and the conductivity of the metallurgy.

Promoting the adhesion of the abutting materials is still another approach to the mismatch problem. One approach, taught in Japanese patent application 60-096586 of Hitachi Metal KK, is to enhance the adhesion of the abutting materials by increasing the contact surface area. Adhering the materials will not prevent cracking, however. Rather, the good adhesion of these materials can transfer the stresses causing cracks to propagate beyond the boundaries of the adhered materials and into the body of the ceramic located between the metal features.

Still another approach is to enhance the mechanical integrity of the ceramic, using known techniques to increase the crack resistance, i.e. toughness, of the ceramic, as taught in patent application Ser. No. 892,687, filed Aug. 1, 1986, and assigned to the present assignee. The toughening approach is effective; however, the dielectric properties of the ceramic may be adversely affected by the inclusion of toughening agents.

On the other hand, in seeking the ideal dielectric properties, sacrifices are made with regard to both the mechanical integrity of the substrate and its thermal properties. The art is replete with techniques for adjusting the dielectric constant (hereinafter, K) of a device substrate to decrease the capacitance and thereby increase the speed of transmission through the associated metallurgy. IBM *Technical Disclosure Bulletin*, Vol. 20, No. 12, page 5174 (May 1978) teaches the placement of spacers to provide for a layer of air as dielectric (having a K of 1) in series with the glass dielectric for a multi-layer module. Another approach is to intersperse air throughout the glass or ceramic dielectric itself. A method for accomplishing this is taught in IBM *Technical Disclosure Bulletin*, Vol. 14, No. 9, page 2581 (Feb. 1972) wherein a foam-like glass having controlled amounts of microscopic voids is provided as the low dielectric substrate material. Still another publication, Japanese Patent application 59-111345 teaches the dispersion of hollow spherical powders into the raw ceramic slurry. Said hollow spheres remain intact after low temperature sintering to provide a K of 1 in "solution" with the ceramic dielectric value. Freeze-dried formation of hollow (or air-filled) alumina macropores is the subject of Japanese Patent 59-196740 to Kiyatama Koygakk. Each of the foregoing teachings discloses air-filled, non-permeable ceramic voids. Although adequate as low dielectric materials, the resulting substrates will be incapable of withstanding the thermal and tensile stresses of device joining. Furthermore, the spheres created will still be susceptible to cracking as a result of the thermal expansion mismatch. Moreover, even in the absence of cracking, the interstices of the voids/spheres may be permeable to processing solvents.

It is therefore an objective of the present invention to provide an impermeable substrate, having a low dielectric constant, for device mounting.

It is a further objective of the subject invention to provide a substrate, of low dielectric insulative material and internal metallurgy of high conductivity, which will be impervious to the effects of thermal expansion mismatch.

It is still another objective of the subject invention to provide a material which can be incorporated into an electronic packaging substrate to provide a flexible, hermetic link between the associated materials.

It is yet another objective of the present invention to teach a method for obtaining a uniform, fillable void in a substrate structure wherein the dielectric and metal materials are bonded by a flexible, hermetic linking agent introduced into that void.

BRIEF DESCRIPTION OF THE DRAWINGS

These and other objectives are realized by the subject invention wherein the first embodiment teaches the filling of unwanted gaps and cracks in a substrate by means of impregnation of gaps, etc., with a polymeric fill material. The second embodiment teaches the fabrication of an entirely new composite multilayer substrate wherein a skeletal ceramic network having fixed metallurgical features is completely filled with a polymeric material. The second embodiment yields a ceramic and polymeric substrate having a low dielectric constant with fixed metal features of high conductivity, wherein the polymeric material provides the necessary bulk compressibility to yield to the associated materials as they undergo thermal expansion, thereby eliminating the stresses on the ceramic.

The invention will be further described with reference to the included drawings wherein.

DETAILED DESCRIPTION OF THE PREFERRED EMBODIMENT

Figure 1:
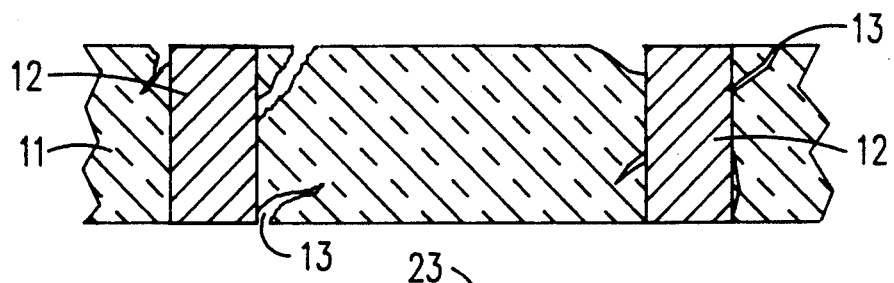
FIG. 1 illustrates a sintered ceramic substrate having metal features therethrough, and illustrates cracking of the ceramic due to the thermal stresses encountered during sintering and other thermal cycling.
Figure 2:
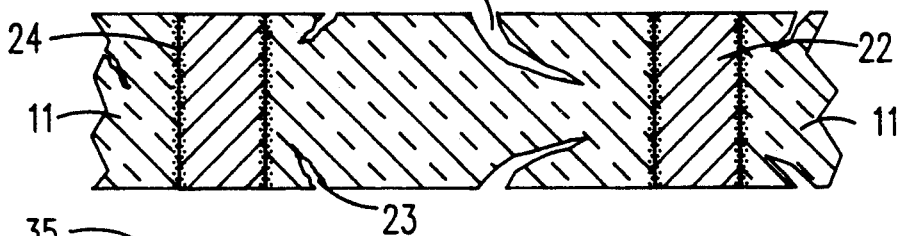
FIG. 2 illustrates a ceramic-metal substrate wherein the bonding at the interfaces of the abutting materials has been enhanced and therefore cracks have been generated in areas removed from the interfaces.

As discussed above, the most desirable qualities for a semiconductor package include a low dielectric constant, high mechanical integrity and good thermal stability. The required values for dielectric constant and TCE are determined, in part, by the values and/or properties of the material, generally silicon or gallium arsenide, used in fabricating the semiconductor devices to be mounted thereon. Matching the thermal expansion coefficient of the substrate and devices eliminates thermally-induced fatigue failures of the interconnections, thereby increasing the life and the reliability of the component. It is also advantageous to match the dielectric constant of the associated materials to eliminate any deleterious capacitance effects. The low permittivity of the insulative packaging material enhances speed through the internal metallurgy, as is quantitatively defined by the relation of the delay being proportional to the square root of the dielectric constant of the package. In the industry, an alumina substrate, having a thermal coefficient of expansion similar to that of silicon, with compatible metallurgy of molybdenum, has been used. Regardless of the specific materials used, however, there will be a thermal expansion mismatch between an insulative material, illustrated as 11 in FIG. 1, and the metallurgy, illustrated in FIG. 1 as 12. If the insulator/metallurgy package is subjected to thermal cycling during processing, the mismatch in thermal expansion will manifest itself by generating cracks, 13, in the ceramic. The existence of cracks which are open to the top surface of the ceramic renders the substrate permeable to processing solutions and ambients, the presence of which could compromise the integrity of, if not destroy, the package. As noted above, prior art solutions to the permeability problem have not adequately addressed the root problem or have introduced new variables which otherwise degrade the overall characteristics of the product. FIG. 2 illustrates the approach of enhancing the adhesion of the ceramic to the metallurgy. As is evident therein, at 23, cracking of the ceramic can still occur. The enhanced ceramic-metal bond, 24, may not break; however, this point will be the locus of highest tension during thermal cycling. Since the ceramic-metal bond will not itself crack, the thermal expansion mismatch will place the surrounding ceramic under tremendous stress. That stress can cause the ceramic to crack at points away from the bond and those cracks will be generated out to the surface of the substrate as illustrated at points 23. Therefore, it is imperative to address the problem by matching TCE's or otherwise compensating for the TCE mismatch and the stresses resulting therefrom. The present invention includes a remedy for the problems encountered. In addition, the present application teaches and claims a new technology including a low dielectric composite structure, and methods for producing the same, wherein the TCE and K incompatibility problems encountered by the packaging industry are avoided.

Specifically, prior art substrates can be "salvaged" by the use of the remedial embodiments claimed herein. Furthermore, a new composite structure is taught which can replace crack-prone ceramic/metal packages.

What is herein addressed is the need to provide a remedy in the form of a flexible link between the TCE-incompatible packaging materials found in the semiconductor packaging industry today. As discussed in the Background section, there are prior art teachings directed to filling cracks created by the stresses experienced during thermal cycling. The remedial materials suggested, however, are glass or other inorganic dielectrics, which presumably have similar thermal properties to those of the insulative material. Again, the possibility of re-cracking or new cracking is not addressed. What is needed is a structure wherein a flexible fill material is chosen to provide the bulk compressibility, or analogous mechanical properties, to absorb the stresses, or to translate the stresses away from the ceramic. What is herein proposed is the use of a temperature-stable polymeric material to fill the gaps and/or cracks which are created during high temperature processing of the ceramic package. Specifically, the polymer fill material must be stable to the temperatures encountered in the processing of the package subsequent to infusion of the fill material.

Figure 3:
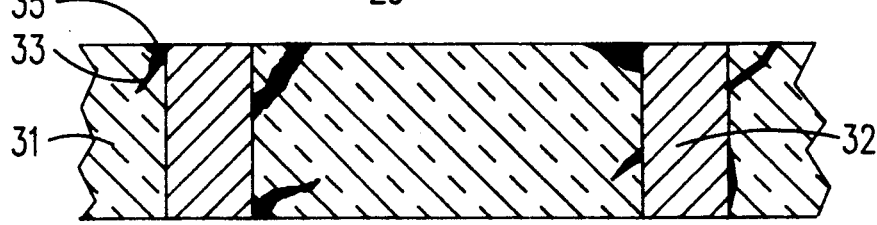
FIG. 3 illustrates one embodiment of the subject invention whereby the cracks in the ceramic are filled.
Figure 4:
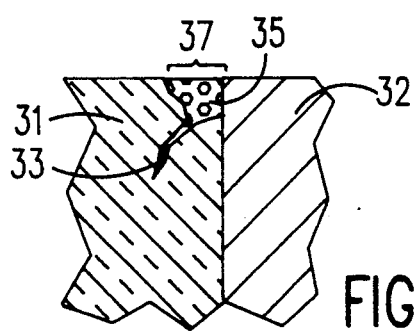
FIG. 4 is an enlarged view of the structure of FIG. 3 after one filling step in accordance with the subject invention.
Figure 5:
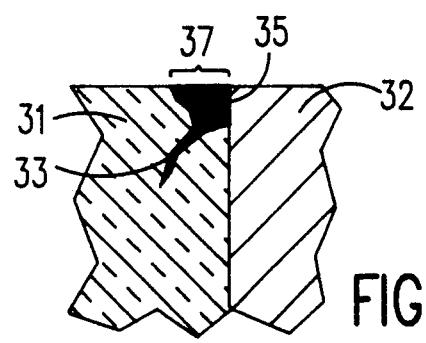
FIG. 5 illustrates an enlarged view of the structure of FIG. 3 after several filling steps.

In accordance with known package processing, such as is taught in U.S. Pat. Nos. 3,770,529, 4,234,367 and 4,301,324, incorporated by reference herein, ceramic, glass-ceramic or alumina greensheets are cast, patterned, and then metallized. The metallized greensheets are then stacked and sintered at extremely high temperatures. As discussed in the aforementioned TDB articles, it is during the heating and cooling associated with the sintering step that cracks may occur in the ceramic, as illustrated in FIG. 1, at 13. Post-sintering process steps, such as device joining, may involve the additional use of high temperatures which may promote more cracking or the propagation of existing cracks, and may further involve the use of processing solvents which can permeate the cracks in the substrate and interfere with subsequent processing. Trapped solvents may also interfere with the functioning of the finished package. Therefore, it is most advantageous to fill the cracks immediately after the sintering has been completed. FIG. 3 illustrates the substrate of FIG. 1 after a crack-filling step has been performed. The cracks therein, 33, have been filled with a polymeric material, 35. The polymer is introduced into the substrate by use of screening, vacuum, or analogous impregnation processes in order to assure that all points of exposure have been filled. The exact process by which the polymer is introduced into the substrate is not a critical part of the present invention, as one having ordinary skill in the art can ascertain methods to obtain the desired result in addition to the suggested methods of melt flow, soaking by capillary action, vacuum impregnation by evacuating and soaking, filling by vapor transport and filling by injection molding. The desired properties which the fill material must possess include excellent adhesion to the metal and the substrate material, high thermal and oxidative stability, and good resistance to humidity. Suitable materials including thermally-stable silicon-containing polymers such as silanes, siloxanes, silazanes, organosiloxanes, and polyimides, epoxies and bismaleimides. As one having skill in the polymer art may ascertain, the polymeric material must be sufficiently fluid at a given temperature, for vacuum impregnation, soaking, melt flow or injection molding, to allow for impregnation of the voids and must then be curable upon treating, preferably heat curing, in situ. As an example, and with reference to FIG. 4, one may introduce a temperature-stable polymer in solution, such as a BTDA-APB derived polyimide in appropriate solvent to fill the cracks, 33. The structure may then be heated, to between 125°–165° C., to drive off the solvents and to cure or imidize the polymer, in situ in accordance with known polymer processing requirements. When a solvent system is used, volume loss may be experienced during the step of driving off the solvent. If the remaining volume of cured polymer has sufficiently "plugged" the exposed surfaces, 37, of the substrate, and is thereby providing the desired hermeticity, no further processing is necessary. The vacuum-filled voids within the three dimensional matrix of the cured polymer, 35, will serve to absorb the tensile stresses encountered during thermal cycling. If, however, the surface of the substrate is not fully sealed upon the completion of the initial curing, the vacuum impregnation, solvent removal and polymer curing steps may be repeated until a more complete fill is achieved, see FIG. 5. In the instance where the voids in the ceramic have been completely filled, i.e. fully dense with the polymer, the polymer will still operate to reduce the stress on the ceramic, 31. Specifically, rather than the above-discussed mechanism whereby the vacuum-filled voids in the polymer provide bulk compressibility, here the dense polymer itself, 35, will absorb the stresses and, due to its superior mechanical/elastic properties, translate the x-y components of stress to an expansion of the polymer alone. For example, where the polymer is continuous in the z-direction to the surface of the substrate, as in FIG. 5 at 37, the x-y components will be translated into z-direction extrusion of the polymer at that unobstructed surface, effectively reducing stress on the ceramic. A sample fill system which has been applied in thick films to a cordierite and copper system was a silicon-containing system comprising 1,1 polydimethylsilazane in n-butyl acetate (1:1 ratio). After a 500° bake in $N_2$, the amorphous, glass-like film exhibited superior adhesion to the substrate, with no cracking evident upon thermal cycling.

The voids in the ceramic can be filled not only by the repeated fill and cure steps using a solvent-based system, but also by direct introduction of the polymer to the voids. This may be accomplished either by using a system wherein the solvent reacts with the solute upon curing thereby yielding little or no volume loss, such as an epoxy system, or by providing a polymer which can be introduced as a pure vapor or fluid and subsequently cured in situ. Again, the fill material should possess the desired properties, including high thermal and oxidative stability and good adhesion to the ceramic and the metal. A further desirable property of the fill material is to effect curing without the need for exposure to the atmosphere for outgassing, since the bulk of the polymer will not be exposed to the surface atmosphere. In order for the fill material to penetrate the most minute fissures, it is desirable to use a material with a relatively low viscosity and low surface tension. Not only is it necessary for the fill material to be thermally stable, but it must also be inert to any processing solvents to which it may be exposed in the subsequent package fabrication steps. It is also desirable, of course, to have a low dielectric constant material with a low TCE. The TCE of most of the applicable polymeric materials is higher than that of either the dielectric material or the internal metallurgy which is commonly used for packaging applications; however, since the polymers have the requisite mechanical properties, the fill material can effectively dissipate the stress of its own expansion along with the components of stress imparted by the expanding dielectric and metallurgy, the net effect of which is reduction of stress in the package. Suitable polymers include not only organic polymers such as epoxies, polyimides, bismaleimides and acetylenes but also inorganics such as silanes, silazanes and siloxanes, and organosiloxanes such as silicones. In general, it has been found that linear polymers do not maintain their integrity upon subsequent thermal cycling. A preferred silicon-containing polymer, then, would be a sesquisiloxane or silazane wherein the polymer, upon curing, would cross-link and not depolymerize during the thermal excursions encountered in chip joining and related processes.

Figure 6A:
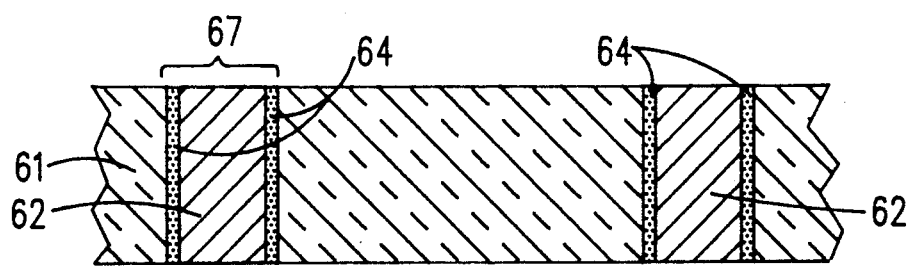
FIG. 6A, 6B and 6C illustrate a ceramic and metal structure wherein the materials are not abutting; the structure is fabricated with fugitive paste (6A) which forms a uniform gap (6B) to be filled (6C) in accordance with one of the inventive teachings.
Figure 6B:
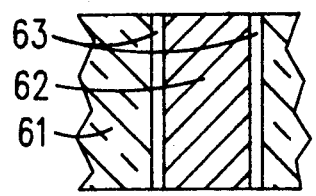
Figure 6C:
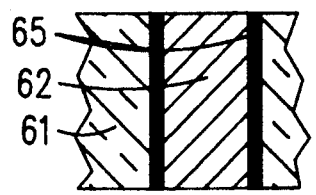

Needless to say, in the usual course of fabrication, the cracks generated in the ceramics are non-uniform and non-linear. If a crack has not propagated directly out to the surface of the substrate, it may nevertheless be possible to fill the crack by means of the vacuum impregnation techniques. However, such an encapsulated crack in the body of the ceramic, which has been completely filled with a high expansion polymer cannot relieve the stress on the ceramic. Rather, it will intensify the stress when the polymer attempts to translate the stresses, having no unobstructed, surface facing for expansion. Ideally, one would like to have a substrate, as illustrated in FIG. 6A-C, wherein a uniform gap is created between the ceramic and the metallurgy. This uniform gap will allow the expansion of the materials without any attendant stress on the low fracture strength ceramic. By filling the uniform gap with a polymer, either with the techniques described above or by more traditional fluid flow techniques, one can join the substrate materials, seal the exposed surfaces and provide the bulk compressible material to absorb, or the elastic material to translate, the thermal expansion stresses. A substrate fabrication process for achieving such a uniform gap involves the use of a double screening technique when applying the metallurgy to the punched greensheet. Specifically, after punching, a first screening is performed to coat the surfaces of the via hole, 67 in FIG. 6A, with a "fugitive paste", 64. After the coating layer is dried, the metallurgy, 62, is screened into the remaining void space in the via hole, yielding the structure illustrated in FIG. 6A. The substrate is then sintered in accordance with the known technology. The fugitive paste, 64, is chosen to provide a structural frame during the screening process but to burn off during the sintering step, preferably at a temperature higher than that at which the metallurgy has sintered and the ceramic has densified. A sample paste for this purpose is terephthalic acid which will coat the via walls for screening purposes and maintain structural integrity through the binder burn out temperatures taught in Kumar 4,301,324 and Herron 4,234,367, but will burn off during sintering. The resulting structure, as illustrated in FIG. 6B, has fully sintered metallurgy standing freely in alignment with the surrounding ceramic. The substrate may then be subjected to a filling step by which the suitable polymer is impregnated into the uniform gaps, 65 in FIG. 6C. Another embodiment of this process would be to provide, upon the first screening, a coating material which will remain as a porous collar about the metallurgy after sintering. This alternate material must provide the structural and thermal integrity to withstand the sintering step and must be porous upon sintering so that it may be filled with a polymer to, again, provide the mechanical properties desired with reference to TCE mismatch. The coating material should also promote adhesion of the associated materials and not degrade the conductivity nor compromise the insulative qualities of the associated materials. An example of such a coating material is a collar of metal paste, of the same metallurgy to be used in the via itself, along with a sintering retardant; so that, during the sintering step, the paste will not sinter but will remain as a porous, fillable metal collar about the pure metal via. An example for a high conductivity via structure is a pure copper core via with a copper plus alumina collar material. The collar material will not sinter but will remain porous and "fillable". The proposed collar material will additionally promote adhesion between the copper via and the oxide ceramic which will contribute to less permeability and therefore fewer sites requiring infusion of the backfill material.

Uniform fillable gaps or unmetallized via holes or grooves could be provided in the substrate body in addition to or in lieu of those proposed to be located at the metal via holes. Any fillable void, which has an unobstructed exposed surface and which has been filled with a suitable polymer, should provide relief from the TCE mismatch stresses. It appears to be most advantageous, however, to provide the uniform, fillable gaps in alignment with the metal via holes in order to facilitate the fabrication steps. In addition, the polymer can promote adhesion between the associated materials if it is located therebetween. Intervening polymer may serve as an efficient insulating means adjacent to the conductors; polyimide, for example, having a dielectric constant of 2.5-3.0. Furthermore, the abutting relationship of the polymer to the expanding materials will allow the polymer to more effectively absorb and/or translate the attendant stresses. If the polymer is separated from the point of maximum stress, the intervening expanse of ceramic may well crack before the stress could be alleviated at the polymer-ceramic interface.

A further alternative to the use of a uniform fillable gap or a uniform fillable porous metal collar is the use of a via material which is entirely porous, and therefore fillable. Since the expansion of a pure metal can cause shearing and resultant cracking, a metallic paste is used to fill the via. Specifically, a composite via may be fabricated from a mixture of a ceramic or a ceramic and glass and the conductive metallurgy, such as copper. The conductivity of the via may be compromised slightly in favor of the more favorable adhesion and expansion characteristics. Upon sintering, the composite via will exhibit excellent adhesion to the ceramic via walls. The sintered composite material will have minute but continuous porosity which can be backfilled in accordance with the foregoing teachings in order to obtain the desired hermeticity and flexibility. In addition, the composite material will have a TCE which is lower than that of pure metal, thereby reducing the chances of stress-induced cracking during subsequent thermal processing. As a fill material, siloxane provides excellent thermal and oxidative characteristics along with favorable viscosity and surface tension to allow for permeation of minute fissures. It is speculated that a conductive polymer may be introduced into the interstices, thereby providing not only a hermetic and flexible link but also enhanced conductivity in the via.

EXAMPLE 1

A sample substrate may be fabricated in accordance with the following procedure shown by way of example. The inventors do not wish to be limited to the exact materials and processes recited herein.

A slurry of crystallizable glass, binders and solvents is mixed and cast into greensheets. The greensheets, when dry, are patterned by punching and metallized with a pure metal or metal paste. For use with a crystallizable glass ceramic, lower temperature, high conductivity metals can be used. Examples of appropriate metallurgy include gold, silver, copper, platinum and palladium or alloys thereof. For the cordierite-based system of the example, a copper-based metallurgy is screened into the pattern of via holes in two screening steps. A first, or collar, paste comprised of copper and alumina is applied to the inside wall of the via hole. Pure copper is then applied to the core of the via hole. After lamination of the stacked sheets, the part is inserted into a furnace and subjected to a firing profile as taught in Herron, et al. (U.S. Pat. No. 4,234,367) wherein the copper is sintered and the glass-ceramic densifies and crystallizes while the copper in the collar paste is retarded from sintering and remains porous. After cooling, the fired substrate is subjected to a vacuum impregnation of a BTDA-APB-derived, high temperature polyimide to fill the porosity associated with the via collar and any cracking of the ceramic body which may have occurred. The part is then heated to a temperature of 125°-165° C. to imidize the polymer.

A preferred embodiment of the invention includes a multilayer substrate which is not only sporadically backfilled but thoroughly infused with the polymeric material. The entire substrate body is a composite of metallized ceramic and polymer. Such a composite substrate is obtained by fabricating a skeletal ceramic structure with sintered metallurgical features and impregnating the entire skeletal structure with a polymer. The skeletal ceramic structure can be fabricated of a ceramic such as alumina, borosilicate or other glass, borosilicate glass plus silica, silica itself, glass-ceramic, or any other suitable substance which can be fabricated into greensheets, partially or completely sintered into a continuous yet permeable interconnection network at temperatures sufficient to sinter the associated metallurgy, and backfilled with a polymeric material, and which yields the favorable dielectric properties for semiconductor packaging applications. A sample substrate, with alumina as the dielectric material, can be fabricated initially utilizing known techniques; that is, the initial processing steps are the same as have been previously used (see U.S. Pat. No. 3,770,529). A slurry of, for example, alumina with solvent and binder can be mixed, cast and dried in accordance with standard processing. The greensheets can then be punched, blanked and screened with metallurgy as is known. One major point of departure from the present state-of-the-art fabrication techniques can be noted at this stage of processing; specifically, a pure metal can be used without the threat of the cracking or shearing effects encountered during firing, since the alumina will not densify completely. In addition, since the substrate will not be taken to the maximum sintering temperatures, a lower melting point, higher conductivity metal can be used. After stacking and laminating, the substrate is placed in a furnace having the appropriate ambient and the temperature is raised to that temperature at which the chosen metal sinters. If copper is used, there is a preference for a non-oxidizing environment and the sintering temperature will be in the range of 900°-950° C., at which temperatures the inorganic alumina grains of the substrate body will neck together but will not densify. The resulting substrate will be a partially densified multilayer substrate having continuous, permeable porosity in the ceramic body about fully sintered metallurgical features. The entire substrate may then be exposed to an impregnation process by which the flexible material, such as BTDA-APB polyimide or a bismaleimide, is introduced.

In the embodiment wherein the entire substrate is backfilled, the via need not be filled with a pure metal, but may be a composite material with improved thermal and adhesive properties. If a composite via composition is used, it may be desirable to effect two impregnating steps whereby the substrate is filled with a first polymeric material and the interstices in the composite via are subsequently filled with a second, non-conductive or conductive polymer. The fissures in the composite via will be smaller than those found in the substrate. Therefore, a polymer having too great a surface tension to fill the minute fissures of the via interstices may be selected to fill the substrate in the first impregnation step. The remaining fissures in the via could then be filled exclusively with the lower surface tension conductive polymer.

The proposed process and structure may be implemented for an entire board or substrate or any increment thereof. In the multilayer ceramic context, it is imperative to seal off permeability at the substrate surfaces. It may only be necessary, therefore, to apply the inventive concept to the outer surfaces of the substrate. As an example, a multilayer ceramic substrate may be fabricated of a glass-ceramic composition in accordance with the teachings found in Kumar, et al U.S. Pat. No. 4,301,324. The greensheets are cast and punched and then metallized with a pure copper or a copper-based metallurgy. The outer layers for the top and bottom surfaces of the substrate will be fabricated of the same glass-ceramic composition with a sintering retardant added. Examples of an appropriate sintering retardant for a glass-ceramic composition of the type taught in Kumar, et al. include but are not limited to silicon nitride, fused silica, mullite, alumina and precrystallized cordierite. Additionally, the sintering retardant may be in the form of a whisker or fiber, for example, silicon nitride or alumina whiskers. The metallized greensheets of glass-ceramic and sintering retardant are then laminated to the top and bottom surfaces of the bulk multilayer ceramic body. The laminate is fired in accordance with the known teachings (see: Herron, et al U.S. Pat. No. 4,234,367 and Kamehara, et al U.S. Pat. No. 4,504,339) to a temperature of 965° C. at which the bulk glass-ceramic undergoes densification and crystallization and the metal or metal-based metallurgy has sintered. The metal associated with the surface layers cosinters to the bulk metal but the surface ceramic does not sinter. It remains porous having formed its continuous, permeable network. Infusion of the appropriate fill material, such as a bismaleimide, may then be performed, as above.

Figure 7A:
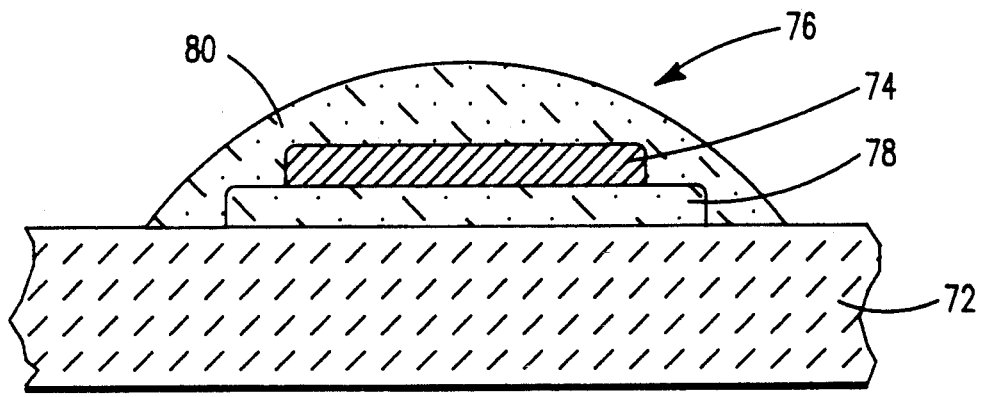
FIGS. 7A, 7B, and 7C illustrate individual greensheets having metallurgical features which are at least partially encapsulated by porous dielectric material.
Figure 7B:
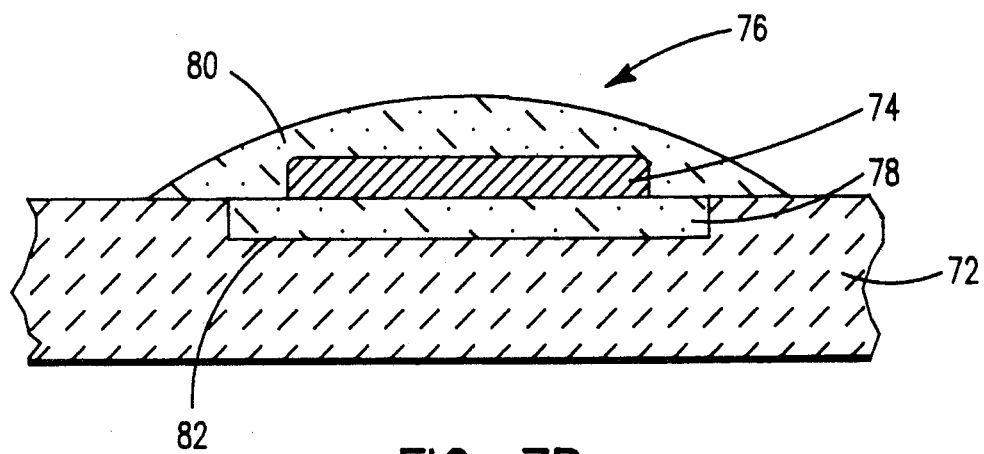
Figure 7C:
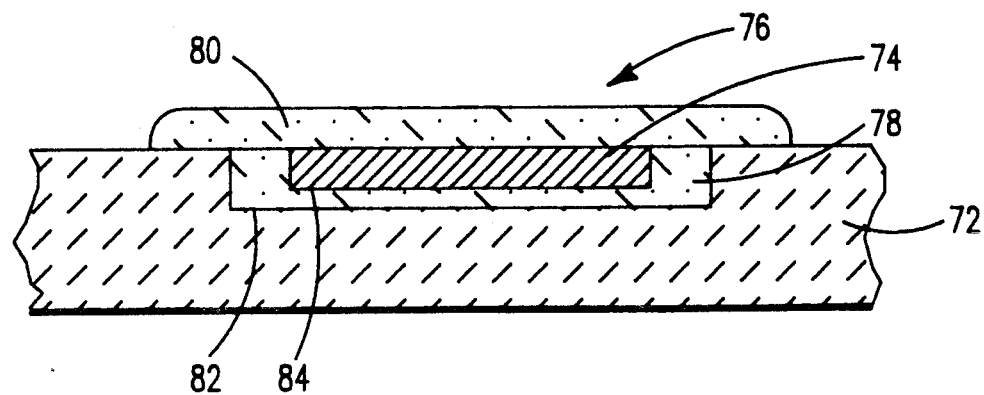

Another embodiment of the invention is shown in FIGS. 7A, 7B and 7C. There, one layer of a multilayered ceramic substrate is shown. Normally, of course, there would be a plurality of such layers but for purposes of illustration, only one such layer is shown. The layer 62 comprises sintered dielectric material. On the layer of sintered dielectric material there is disposed a plurality of patterns of sintered metallurgical features. One such metallurgical feature 64 is shown in the drawings. There is additional porous dielectric material, generally indicated by 66, selectively disposed over at least one layer of the sintered dielectric material and in contact with the metallurgical features such that the additional porous dielectric material at least partially encapsulates the metallurgical features. That is, metallurgical feature 64 is at least partially encapsulated by the additional porous dielectric material 66. Since the additional porous dielectric material 66 is selectively disposed over the layer 62 of sintered dielectric material, the additional porous dielectric material 66 does not form a complete layer or coating over layer 62.

The purpose of the additional porous dielectric material is to locally decrease the dielectric constant of the multilayered ceramic substrate, thereby enhancing the electrical properties of the substrate.

The sintered dielectric material 62 may itself be porous but, in this embodiment of the invention, it is clearly preferred that it be nonporous. In this way, the layers of sintered dielectric material will provide the needed hermeticity for the additional porous dielectric material.

In a preferred embodiment, the additional porous dielectric material is interposed between the metallurgical feature 64 and the sintered dielectric material 62 as shown by 68. In the most preferred embodiment, there is this layer 68 of additional porous dielectric material as well as layer 70 of additional porous dielectric material covering the metallurgical feature so that the additional porous dielectric material entirely encapsulates the metallurgical features.

The additional porous dielectric material may comprise ceramic material and a sintering retardant, as explained previously, in order to form the porosity. Alternatively, the additional porous dielectric material may comprise hollow glass microspheres.

It is contemplated that the previously described embodiment of FIG. 7 may, and often will, be used in conjunction with the previous embodiments of the invention where a polymeric material is disposed within the substrate. In particular, the polymeric material may be used to fill permeable pores in the metallic vias or simply to fill the permeable voids resulting from the mismatch in thermal expansions of the metallic vias and the sintered dielectric material.

The embodiments of FIG. 7 may be made by the tape casting process as described previously. Thus, the steps comprise mixing a slurry comprising at least a dielectric material, a binder and a solvent; casting the slurry into a plurality of greensheets; forming a pattern of via holes in the greensheets; filling the via holes with a conductive material; applying a plurality of conductive patterns on at least one of the greensheets, wherein each of the patterns comprises a metallurgical feature at least partially encapsulated by selectively disposed additional dielectric material; stacking the greensheets in alignment with each other; laminating the stack; and then firing the stack to a temperature sufficient to sinter the dielectric material and the metallurgical features but not sufficient to densify the additional dielectric material such that the additional dielectric material contains porosity.

The step of applying a plurality of conductive patterns may comprise first applying the metallurgical features on the the greensheets followed by applying the additional dielectric over the metallurgical features. The end result of this method would be to have metallurgical feature 64 and additional porous dielectric 70. The metallurgical features and the additional dielectric material may be applied by conventional screening methods or by other methods such as decal transfer, lithography, etc.

Alternatively, the step of applying a plurality of conductive patterns may comprise first applying the additional dielectric material on the greensheets followed by applying the metallurgical features on the additional dielectric material followed by applying additional dielectric material over the metallurgical features. The end result of this method would be to have metallurgical features 64 encapsulated by additional dielectric material 68 and 70.

Additional dielectric material 68 may be simply screened, for example, on the surface of the greensheet as shown in FIG. 7A. Alternatively, the additional dielectric material 68 and/or the metallurgical feature 64 may be disposed in a cavity within the greensheet as shown in FIGS. 7B and 7C. In FIG. 7B, a cavity 72 is formed in the greensheet by a laser, for example, and then additional dielectric material 68 is disposed therein. Thereafter, the metallurgical feature 64 and additional dielectric material 70 are disposed over the additional dielectric material 64. In FIG. 7C, cavity 72 is formed in the greensheet for additional dielectric material 68. Thereafter, a second cavity 74 is formed in the additional dielectric material 68 for metallurgical feature 64. Finally, additional dielectric material 70 is disposed over metallurgical feature 64.

While the subject invention has been taught with reference to specific embodiments, the invention is not intended to be limited to the specifically described materials, structures and processes. One having skill in the art will recognize modifications and extensions of the teachings within the spirit and scope of the appended claims wherein:

What is claimed is:

1. A substrate for interconnecting electronic components comprising:
a non-porous dielectric body;
metallurgical features associated with said dielectric, said metallurgical features having permeable pores; and
a polymeric material within said permeable pores, wherein said polymeric material is a polymeric material selected from the group consisting of polyimides, bismaleimides, acetylenes, epoxies, and thermally-stable silicon-containing polymers.

2. A multilayered ceramic substrate for mounting semiconductor devices comprising:
a plurality of layers of sintered dielectric material;
a plurality of patterns of metallurgical features disposed on said dielectric material layers, said features having permeable pores; and
a polymeric material within said permeable pores, wherein said polymeric material is a polymeric material selected from the group consisting of polyimides, bismaleimides, acetylenes, epoxies, and thermally-stable silicon-containing polymers.

3. A substrate for mounting semiconductor devices comprising:
at least one layer of non-porous dielectric material having a pattern of via openings for receiving metallurgical features;
first metallurgical features in said via openings, said first metallurgical features having a diameter smaller than the diameter of said via openings; and
a polymeric material surrounding said first metallurgical features and abutting said dielectric material, wherein said polymeric material is a polymeric material selected from the group consisting of polyimides, bismaleimides, acetylenes, epoxies, and thermally-stable silicon-containing polymers.

4. The substrate of claim 3, additionally comprising second metallurgical features disposed on the surfaces of said at least one layer of sintered dielectric material.

5. The substrate of claim 4, wherein said first and said second metallurgical features comprise the same metallurgy.

6. A substrate for electrically interconnecting components comprising:
   a sintered dielectric material having permeable pores therein;
   sintered metallurgy disposed in said dielectric; and
   a polymeric material within said permeable pores, wherein said polymeric material is a polymeric material selected from the group consisting of polyimides, bismaleimides, acetylenes, epoxies, and thermally-stable silicon-containing polymers.

7. The substrate of claim 6, wherein said sintered dielectric material comprises:
   a plurality of layers of sintered ceramic material; and
   at least one surface layer comprising ceramic material and a sintering retardant, said at least one surface layer having permeable pores.

8. In a substrate for mounting electronic devices comprising dielectric material having metallurgical features, there being a mismatch in the respective thermal expansions of the materials resulting in permeable voids in said substrate, the improvement comprising:
   a polymeric material disposed in said permeable voids, wherein said polymeric material is a polymeric material selected from the group consisting of polyimides, bismaleimides, acetylenes, epoxies, and thermally-stable silicon-containing polymers.

9. A multilayered ceramic substrate for mounting semiconductor devices comprising:
   a continuous network of metallized dielectric material comprising a co-fired glass-ceramic material and sintering retardant thereof, said continuous network having permeable interstices; and
   a flexible polymeric material disposed in said permeable interstices, wherein said polymeric material is a polymeric material selected from the group consisting of polyimides, bismaleimides, acetylenes, epoxies, and thermally-stable silicon-containing polymers.

10. The substrate of claim 9 wherein said sintering retardant is selected from the group consisting of silicon nitride, fused silica, mullite, alumina and precrystallized cordierite.

11. The substrate of claim 9 wherein said dielectric material comprises alumina, borosilicate glass, borosilicate glass plus silica, silica or glass-ceramic.

12. A multilayered ceramic substrate comprising:
    a plurality of layers of sintered dielectric material;
    a plurality of patterns of sintered metallurgical features disposed on said dielectric material layers;
    additional porous dielectric material being selectively disposed over at least one layer of said sintered dielectric material and in contact with said metallurgical features such that said additional porous dielectric material at least partially encapsulate said metallurgical features.

13. The substrate of claim 12 wherein said sintered dielectric material is non-porous.

14. The substrate of claim 12 wherein said additional porous dielectric material entirely encapsulate said metallurgical features.

15. The substrate of claim 12 wherein said additional porous material is interposed between said metallurgical features and said sintered dielectric material.

16. The substrate of claim 12 wherein said additional porous material comprises ceramic material and a sintering retardant.

17. The substrate of claim 12 wherein said additional porous material comprises hollow glass microspheres.

18. The substrate of claim 12 further comprising metallic vias in said sintered dielectric material, said metallic vias having permeable pores and a polymeric material disposed within said permeable pores, wherein said polymeric material is a polymeric material selected from the group consisting of polyimides, bismaleimides, acetylenes, epoxies, and thermally-stable silicon-containing polymers.

19. The substrate of claim 12 further comprising metallic vias in said sintered dielectric material, there being a mismatch in the respective thermal expansions of said metallic vias and said sintered dielectric material, resulting in permeable voids in said substrate, and further comprising a polymeric material disposed in said permeable voids, wherein said polymeric material is a polymeric material selected from the group consisting of polyimides, bismaleimides, acetylenes, epoxies, and thermally-stable silicon-containing polymers.

* * * * *